(12) United States Patent
Suzuki et al.

(10) Patent No.: US 9,306,558 B2
(45) Date of Patent: Apr. 5, 2016

(54) FIELD-EFFECT TRANSISTOR

(71) Applicant: SHARP KABUSHIKI KAISHA, Osaka-shi, Osaka (JP)

(72) Inventors: Takamitsu Suzuki, Osaka (JP); Takahiko Andoh, Osaka (JP); Satoshi Morishita, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/438,316

(22) PCT Filed: Oct. 2, 2013

(86) PCT No.: PCT/JP2013/076853
§ 371 (c)(1),
(2) Date: Apr. 24, 2015

(87) PCT Pub. No.: WO2014/073295
PCT Pub. Date: May 15, 2014

(65) Prior Publication Data
US 2015/0295573 A1     Oct. 15, 2015

(30) Foreign Application Priority Data

Nov. 9, 2012 (JP) .................................. 2012-247770

(51) Int. Cl.
| | |
|---|---|
| *H03K 17/687* | (2006.01) |
| *H01L 29/417* | (2006.01) |
| *H01L 29/778* | (2006.01) |
| *H01L 29/20* | (2006.01) |
| *H01L 27/02* | (2006.01) |
| *H01L 27/06* | (2006.01) |

(Continued)

(52) U.S. Cl.
CPC .......... *H03K 17/687* (2013.01); *H01L 27/0207* (2013.01); *H01L 27/0617* (2013.01); *H01L 29/2003* (2013.01); *H01L 29/205* (2013.01); *H01L 29/41758* (2013.01); *H01L 29/7786* (2013.01); *H01L 29/7787* (2013.01); *H01L 21/823475* (2013.01); *H01L 24/05* (2013.01); *H01L 27/0883* (2013.01)

(58) Field of Classification Search
USPC ................................................. 327/365–508
See application file for complete search history.

(56) References Cited

U.S. PATENT DOCUMENTS 2,743,640 A * 5/1956 Verkuil .............. H01H 85/0208
                                                           81/3.8
3,415,147 A * 12/1968 Frydryk ................... D06H 7/02
                                                     83/170

(Continued)

FOREIGN PATENT DOCUMENTS

| JP | 9-64063 A | 3/1997 |
|---|---|---|
| JP | 2000-49169 A | 2/2000 |

(Continued)

*Primary Examiner* — Brandon S Cole
(74) *Attorney, Agent, or Firm* — Birch, Stewart, Kolasch & Birch, LLP

(57) ABSTRACT

This FET includes: a source electrode pad, which is formed on a source electrode and which is electrically connected to the source electrode; and/or a drain electrode pad, which is formed on the drain electrode and which is electrically connected to the drain electrode. The source electrode pad has a cutout for reducing a parasitic capacitance between the source electrode pad and the drain electrode, and the drain electrode pad has a cutout for reducing a parasitic capacitance between the drain electrode pad and the source electrode.

11 Claims, 10 Drawing Sheets

(51) Int. Cl.
*H01L 29/205* (2006.01)
*H01L 21/8234* (2006.01)
*H01L 27/088* (2006.01)
*H01L 23/00* (2006.01)

(56) References Cited

U.S. PATENT DOCUMENTS

| | | | |
|---|---|---|---|
| 5,792,165 A * | 8/1998 | Klieman | A61B 17/29 606/170 |
| 6,074,869 A * | 6/2000 | Pall | B01D 61/18 422/429 |
| 2010/0213503 A1 | 8/2010 | Yanagihara et al. | |
| 2013/0087858 A1 | 4/2013 | Yanagihara et al. | |
| 2013/0119486 A1 | 5/2013 | Kaibara et al. | |
| 2015/0068949 A1 * | 3/2015 | Raschke | H01L 21/67369 206/711 |

FOREIGN PATENT DOCUMENTS

| | | |
|---|---|---|
| JP | 2000-156468 A | 6/2000 |
| JP | 2003-282625 A | 10/2003 |
| JP | 2006-351691 A | 12/2006 |
| JP | 2010-103158 A | 5/2010 |
| JP | 2011-29386 A | 2/2011 |
| JP | 2012-23074 A | 2/2012 |
| WO | WO 2009/139457 A1 | 11/2009 |

* cited by examiner

FIELD-EFFECT TRANSISTOR

TECHNICAL FIELD

The present invention relates to a GaN-based field-effect transistor.

BACKGROUND ART

A conventional GaN-based FET (Field-Effect Transistor) is known from PTL1 (JP 2012-23074 A), in which with via holes provided in an insulating film formed on finger-like source electrodes and drain electrodes, a source electrode pad and a drain electrode pad are formed so as to be electrically connected to the source electrodes and the drain electrodes, respectively, through the via holes so that a pad-on-element structure is made up for implementation of device compaction.

However, in FETs of the pad-on-element structure, the source-drain parasitic capacitance, i.e. a parasitic capacitance between the source and the drain, tends to become large. A large source-drain parasitic capacitance incurs such failures as ringing in switching operations, decreases in switching speed, increases in switching loss or the like, as a problem.

In another case, PTL2 (JP 2011-29386 A) discloses a semiconductor device in which a normally-ON type GaN FET and a normally-OFF type Si MOSFET (Metal Oxide Semiconductor Field-Effect Transistor) are connected in cascode so as to implement normally-OFF operation.

With this semiconductor device, there is a problem that upon switching from ON to OFF state, the connecting point (cascade connecting point) between the source of the GaN FET and the drain of the Si FET shows such an instantaneous rise in potential that a surge voltage is generated at the cascade connecting point, causing the Si MOSFET of low withstand voltage to be deteriorated and, in some cases, broken down. The surge voltage generated at the cascode connecting point can be considered to be due to the source-drain parasitic capacitance of the GaN FET.

CITATION LIST

Patent Literature

PTL1: JP 2012-23074 A
PTL2: JP 2011-29386 A

SUMMARY OF INVENTION

Technical Problem

Accordingly, an object of the invention is to provide a field-effect transistor which can be reduced in the parasitic capacitance between the source and the drain.

Solution to Problem

In order to solve the problem, the present invention provides a field-effect transistor comprising:
a source electrode provided on an active region;
a drain electrode provided on the active region; and
a gate electrode provided between the source electrode and the drain electrode, the field-effect transistor further comprising at least one of
a source electrode pad formed on the source electrode and electrically connected to the source electrode, and
a drain electrode pad formed on the drain electrode and electrically connected to the drain electrode, wherein
the source electrode pad has a cutout for reducing a parasitic capacitance between the source electrode pad and the drain electrode, and
the drain electrode pad has a cutout for reducing a parasitic capacitance between the drain electrode pad and the source electrode.

According to the field-effect transistor of this invention, since the source electrode pad has the cutout, the parasitic capacitance between the source electrode pad and the drain electrode can be reduced. Also, since the drain electrode pad has the cutout, the parasitic capacitance between the drain electrode pad and the source electrode can be reduced.

The invention provides A field-effect transistor comprising:
a source electrode provided on an active region of the field-effect transistor;
a drain electrode provided on the active region;
a gate electrode provided between the source electrode and the drain electrode;
a source electrode pad formed on the source electrode and electrically connected to the source electrode; and
a drain electrode pad formed on the drain electrode and electrically connected to the drain electrode,
the source electrode and the drain electrode each extending in a finger-like configuration,
the source electrode being formed so as to neighbor the drain electrode in a direction crossing a lengthwise direction in which the finger-like drain electrode extends, the source electrode extending in the lengthwise direction, and
an insulating layer provided on the drain electrode, the source electrode and the gate electrode, wherein
in the source electrode pad, an area of coverage regions over the drain electrode is smaller than an area of coverage regions over the source electrode, and
in the drain electrode pad, an area of coverage regions over the source electrode is smaller than an area of coverage regions over the drain electrode.

In the field-effect transistor of this invention, by the feature that in the source electrode pad, the area of coverage regions over the drain electrodes is smaller than the area of coverage regions over the source electrode, the source-drain parasitic capacitances can be reduced. Also, by the feature that in the drain electrode pad, the area of coverage regions over the source electrode is smaller than the area of coverage regions over the drain electrode, the source-drain parasitic capacitance can be reduced.

In one embodiment of the invention, the field-effect transistor comprises a GaN-based multilayer body having a heterojunction, wherein
the finger-like source electrode, the finger-like drain electrode and the insulating layer are formed on the GaN-based multilayer body,
the drain electrode pad is electrically connected to the drain electrode through a via hole formed in the insulating layer, and
the source electrode pad is electrically connected to the source electrode through a via hole formed in the insulating layer.

In one embodiment of the invention, the finger-like drain electrode (87) and the finger-like source electrode are arrayed in plurality so as to be alternated in the direction crossing the lengthwise direction, and
the drain electrode pad has:
a bonding portion for bonding use, a plurality of lengthwise-direction portions extending in the lengthwise direction along the drain electrodes, and a connecting portion extending in a direction crossing the lengthwise direction and connecting to two adjacent lengthwise-direction portions, and wherein in the connecting portion, an area of a first portion separated from the bonding portion by a first distance is larger than an area of a second portion separated from the bonding portion by a second distance longer than the first distance.

According to this embodiment, by the feature that the area of the first portions of the connecting portion closer to the bonding portion of the drain electrode pad is larger than the area of the second portions of the connecting portion farther from the bonding portion of the drain electrode pad, the current collecting efficiency can be improved.

In one embodiment of the invention, the finger-like drain electrode and the finger-like source electrode are arrayed in plurality so as to be alternated in the direction crossing the lengthwise direction, and the source electrode pad has:
a bonding portion for bonding use,
a plurality of lengthwise-direction portions extending in a lengthwise direction along the source electrodes, and
a connecting portion extending in a direction crossing the lengthwise direction and connecting to two adjacent lengthwise-direction portions, and wherein in the connecting portion, an area of first portions separated from the bonding portion by a first distance is larger than an area of second portions separated from the bonding portion by a second distance longer than the first distance.

According to this embodiment, by the feature that in the connecting portion of the source electrode pad, the area of the first portions closer to the bonding portion is larger than the area of the second portions farther from the bonding portion, the current collecting efficiency can be improved.

In one embodiment of the invention, the finger-like drain electrode and the finger-like source electrode are arrayed in plurality so as to be alternated in a direction crossing the lengthwise direction, and the drain electrode pad has:
a bonding portion for bonding use,
a plurality of lengthwise-direction portions extending in a lengthwise direction along the drain electrodes, and
a connecting portion extending in a direction crossing the lengthwise direction and connecting to two adjacent lengthwise-direction portions and moreover reaching the bonding portion, and wherein
the bonding portion is placed at a generally center of the drain electrode pad.

According to this embodiment, since the bonding portion is placed at a generally center of the drain electrode pad, the current collecting efficiency can be improved.

In one embodiment of the invention, the finger-like drain electrode and the finger-like source electrode are arrayed in plurality so as to be alternated in the direction crossing the lengthwise direction, and the source electrode pad has:
a bonding portion for bonding use,
a plurality of lengthwise-direction portions extending in the lengthwise direction along the source electrodes, and
a connecting portion extending in a direction crossing the lengthwise direction and connecting to two adjacent lengthwise-direction portions and moreover reaching the bonding portion, and wherein
the bonding portion is placed at a generally center of the source electrode pad.

According to this embodiment, since the bonding portion is placed at a generally center of the source electrode pad, the current collecting efficiency can be improved.

In one embodiment of the invention, via holes for electrically connecting the drain electrode pad to the drain electrode are formed at positions, in the insulating layer, corresponding to lengthwise end portions of the drain electrode pad.

According to this embodiment, since the drain electrode pad is electrically connected to the drain electrode through the via holes formed at the positions, in the insulating layer, corresponding to the lengthwise end portions of the drain electrode pad, the current collecting efficiency can be improved.

In one embodiment of the invention, via holes for electrically connecting the source electrode pad to the source electrode are formed at positions, in the insulating layer, corresponding to lengthwise end portions of the source electrode pad.

According to this embodiment, since the source electrode pad is electrically connected to the source electrode through the via holes formed at the positions, in the insulating layer, corresponding to the lengthwise end portions of the source electrode pad, the current collecting efficiency can be improved.

In one embodiment of the invention, the connecting portion of the drain electrode pad includes:
a first connecting portion connecting to two adjacent lengthwise-direction portions, and
a second connecting portion which connects to two adjacent lengthwise-direction portions, and wherein
a lengthwise length between the second connecting portion and a lengthwise center of the drain electrode is longer than a lengthwise length between the first connecting portion and the lengthwise center of the drain electrodes, and
an area of the first connecting portion is larger than an area of the second connecting portion.

According to this embodiment, since the area of the first connecting portion closer to the lengthwise center of the drain electrodes than the second connecting portion is set larger than the area of the second connecting portion, the current collecting efficiency of the drain electrode pad can be improved and moreover the reliability as interconnections can be improved.

In one embodiment of the invention, the connecting portion of the source electrode pad includes:
a first connecting portion connecting to two adjacent lengthwise-direction portions, and
a second connecting portion which connects to the two adjacent lengthwise-direction portions, and wherein
a lengthwise length between the second connecting portion and a lengthwise center of the source electrode is longer than a lengthwise length between the first connecting portion and the lengthwise center of the source electrode, and
an area of the first connecting portion is larger than an area of the second connecting portion.

The present invention provides a cascode connection circuit comprising the field-effect transistor as claimed in any one of claims 1 to 11, wherein
the field-effect transistor is a normally-ON type field-effect transistor,
the cascode connection circuit further comprising a normally-OFF type silicon-based MOS field-effect transistor having a drain electrically connected to a source of the normally-ON type field-effect transistor, and wherein a gate of the normally-ON type field-effect transistor and a source of the normally-OFF type silicon-based MOS field-effect transistor are electrically connected to each other, and on/off control for the cascode connection circuit is exerted by applying a control voltage to a gate of the normally-OFF type silicon-based MOS field-effect transistor. A cascade connection circuit comprising the field-effect transistor, wherein the field-effect transistor is a normally-ON type field-effect transistor, the cascade connection circuit further Comprising a normally-OFF type silicon-based MOS field-effect transistor having a drain electrically connected to a source of the normally-ON type field-effect transistor, and wherein a gate of the normally-ON type field-effect transistor and a source of the normally-OFF type silicon-based MOS field-effect transistor are electrically connected to each other, and on/off control for the cascade connection circuit is exerted by applying a control voltage to a gate of the normally-OFF type silicon-based MOS field-effect transistor.

According to this cascade connection circuit, since the source-drain parasitic capacitance of the normally-ON type field-effect transistor can be reduced, the capacitive coupling ratio can be reduced, increases in the OFF-state drain voltage can be suppressed, increases in the gate voltage can be suppressed, and increases in the midpoint potential Vm can be suppressed. As a result of this, the Si-based MOS field-effect transistor of low withstand voltage can be prevented from breaking down (or deteriorating) due to increases in the midpoint potential Vm.

Advantageous Effects of Invention

According to the field-effect transistor of this invention, since the source electrode pad has cutout, the parasitic capacitance the source electrode pad and the drain electrode can be reduced. Also, since the drain electrode pad has cutout, the parasitic capacitance between the drain electrode pad and the source electrode can be reduced.

DESCRIPTION OF EMBODIMENTS

Hereinbelow, the present invention will be described in detail by way of embodiments thereof illustrated in the accompanying drawings.

First Embodiment

Figure 1:
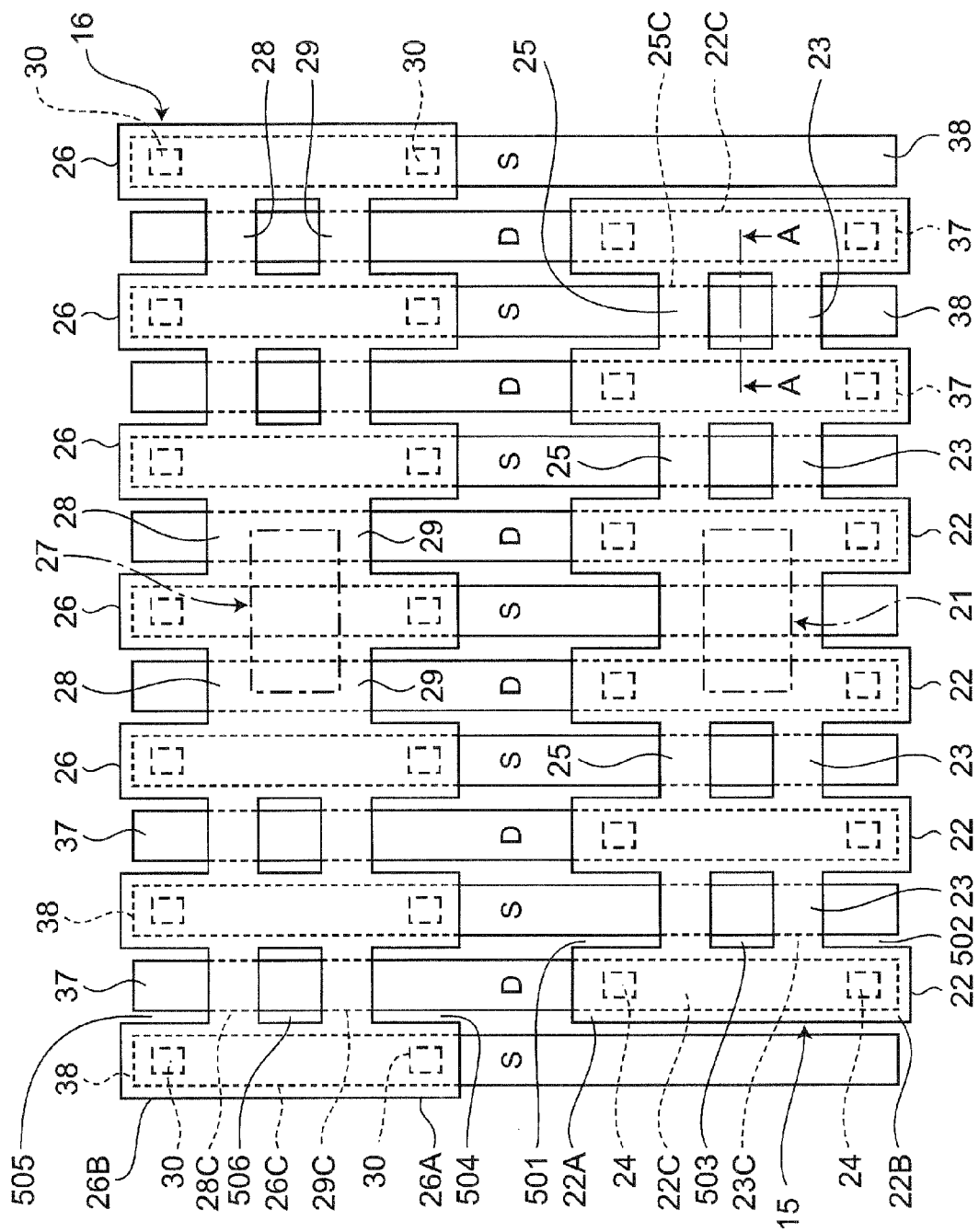
FIG. 1 is a plan view of a first embodiment of an FET according to the present invention.
Figure 2:
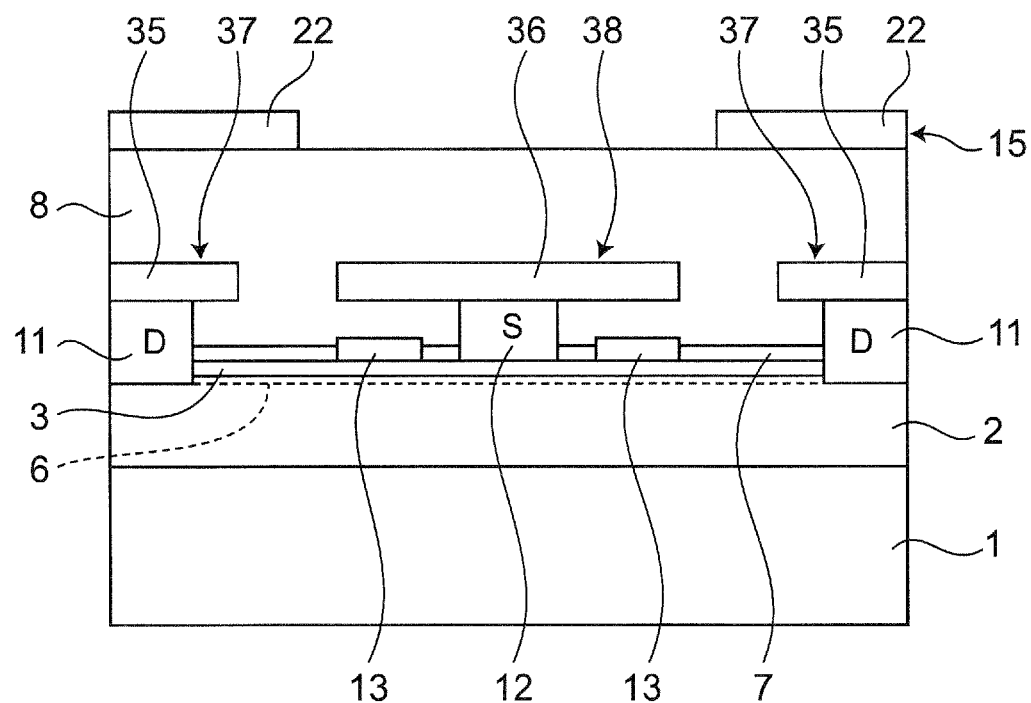
FIG. 2 is a sectional view showing an A-A cross section of FIG. 1.

FIG. 1 is a schematic plan view of a GaN HFET (Heterojunction Field-Effect Transistor) according to a first embodiment of the invention. FIG. 2 is a sectional view showing an A-A cross section of FIG. 1.

As shown in FIG. 2, in this first embodiment, an undoped GaN layer 2 and an undoped AlGaN layer 3 are formed one by one on a Si substrate 1. The undoped GaN layer 2 and the undoped AlGaN layer 3 constitute a GaN-based multilayer body having a heterojunction formed therein. A 2DEG (2-Dimensional Electron Gas) 6 is generated at an interface between the undoped GaN layer 2 and the undoped AlGaN layer 3. Also, a protective film 7 and an interlayer insulating film 8 are formed one by one on the GaN-based multilayer body. Material of the protective film 7, for which SiN is used as an example in this case, may also be $SiO_2$, $Al_2O_3$, or the like. Also, material of the interlayer insulating film 8, for which polyimide is used as an example in this case, may be an insulating material such as SOG (Spin On Glass) BPSG (Boron Phosphorous Silicate Glass) or the like. Film thickness of the SiN protective film 7, which is set to 150 nm as an example in this case, may also be set within a range of 20 nm to 250 nm.

A recess reaching the undoped GaN layer 2 is formed in the GaN-based multilayer body. In this recess, a drain electrode base portion 11 and a source electrode base portion 12 are formed to serve as ohmic electrodes. The drain electrode base portion 11 and the source electrode base portion 12 are provided each as a Ti/Al/TiN electrode as an example, in which Ti layer, Al layer and TiN layer are stacked one by one. Also, on the drain electrode base portion 11, a drain electrode interconnection 35 is formed from the same material as that of the drain electrode base portion 11. On the source electrode base portion 12, a source electrode interconnection 36 is formed from the same material as that of the source electrode base portion 12. The drain electrode base portion 11 and the drain electrode interconnection 35 constitute a drain electrode 37. Also, the source electrode base portion 12 and the source electrode interconnection 36 constitute a source electrode 38.

Also, openings are formed in the protective film 7, and a gate electrode 13 is formed in the openings. The gate electrode 13 is formed of, for example, TiN so as to be a Schottky electrode having Schottky junction with the undoped AlGaN layer 3.

As shown in FIG. 1, this first embodiment has a plurality of finger-like drain electrodes 37 and a plurality of finger-like source electrodes 38. The source electrodes 38 and the drain electrodes 37 are arrayed so as to be alternated in a direction crossing the lengthwise direction in which the drain electrodes 37 and the source electrodes 38 extend in the finger-like configuration.

As shown in FIGS. 1 and 2, a drain electrode pad and a source electrode pad 16 are formed on the interlayer insulating film 8.

The drain electrode pad 15 has a plurality of lengthwise-direction portions 22 extending lengthwise along the drain electrodes 37. Also, the drain electrode pad 15 has a bonding portion 21 for bonding use at a generally central portion. The drain electrode pad 15 further has connecting portions 23, 25 extending in a direction crossing the lengthwise direction and respectively connecting to two adjacent lengthwise-direction portions 22. These connecting portions 23 and connecting portions 25 are separate from each other by a predetermined length in the lengthwise direction. Via holes 24 are formed at positions, in the interlayer insulating film 8, corresponding to both lengthwise end portions 22A, 22B of each lengthwise-direction portion 22 included in the drain electrode pad 15. Through those via holes 24, the lengthwise-direction portions 22 of the drain electrode pad 15 are electrically connected to the drain electrodes 37, respectively.

Also, two lengthwise-direction portions 22 neighboring each other at the generally central portion of the drain electrode pad 15 are integrated with the bonding portion 21, and two connecting portions 23, 25 neighboring each other at the generally central portion of the drain electrode pad 15 are integrated with the bonding portion 21.

The source electrode pad 16 has a plurality of lengthwise-direction portions 26 extending lengthwise along the source electrodes 38. Also, the source electrode pad 16 has connecting portions 28, 29 extending in a direction crossing the lengthwise direction and respectively connecting to two adjacent lengthwise-direction portions 26. These connecting portions 28 and connecting portions 29 are separate from each other by a predetermined length in the lengthwise direction. Via holes 30 are formed at positions, in the interlayer insulating film 8, corresponding to lengthwise end portions 26A, 26B of each lengthwise-direction portion 22 included in the source electrode pad 16. Through those via holes 30, the lengthwise-direction portions 26 of the source electrode pad 16 are electrically connected to the source electrodes 38, respectively. Further, the source electrode pad 16 has a bonding portion 27 for bonding use at a generally central portion.

A lengthwise-direction portion 26 at the central portion of the source electrode pad 16 is integrated with the bonding portion 27, and two lengthwise-direction portions 26 neighboring the bonding portion 27 are integrated with the bonding portion 27. Also, two connecting portions 28, 29 neighboring each other at the generally central portion of the source electrode pad 16 are integrated with the bonding portion 27.

In addition, although not shown in FIG. 1, the gate electrode 13 is connected to a gate electrode pad by gate electrode interconnection.

The GaN HFET of the first embodiment having the above-described structure, being the normally-ON type, is turned off with a negative voltage applied to the gate electrode 13.

As shown in FIG. 1, with regard to the source electrode pad 16 of the first embodiment, an area (S2+S3) of regions 28C, 29C where the connecting portions 28, 29 cover each drain electrode 37, respectively, is smaller than an area S1 of a region 26C where the lengthwise-direction portions 26 cover the source electrodes 38, respectively. Therefore, in this first embodiment, the source electrode pad 16 has an area of coverage regions over the drain electrodes 37 smaller than an area of coverage regions over the source electrodes 38. Thus, the parasitic capacitance between the source electrode pad 16 and the drain electrodes 37 can be reduced.

With regard to the drain electrode pad 15 of the first embodiment, an area (S12+S13) of regions 23C, 25C where the connecting portions 23, 25 cover each source electrode 38, respectively, is smaller than an area S11 of a region 22C where the lengthwise-direction portions 22 cover the drain electrodes 37, respectively. Therefore, the drain electrode pad 15 has an area of coverage regions over the source electrodes 38 smaller than an area of coverage regions over the drain electrodes 37. Thus, the parasitic capacitance between the drain electrode pad 15 and the source electrodes 38 can be reduced.

By virtue of such a structure of the source electrode pad 16 and the drain electrode pad 15 as described above, the source-drain parasitic capacitance can be reduced in this first embodiment. Therefore, according to the first embodiment, the output capacitance which is a sum of the source-drain parasitic capacitance and the gate-drain parasitic capacitance can be reduced. Thus, ringing in switching operations can be prevented so that the switching speed can be improved and the switching loss can be reduced. Moreover, since the output capacitance is decreased, the high-frequency gain is increased.

In this first embodiment, since the drain electrode pad 15 is electrically connected to the drain electrodes 37 through the via holes 24 formed at the positions, in the interlayer insulating layer 8, corresponding to both the lengthwise end portions 22A, 22B of the drain electrode pad 15, the current collecting efficiency can be improved. Also, since the source electrode pad 16 is electrically connected to the source electrodes 38 through the via holes 30 formed at the positions, in the interlayer insulating layer 8, corresponding to both the lengthwise end portions 26A, 26B of the source electrode pad 16, the current collecting efficiency can be improved.

Second Embodiment

Figure 3:
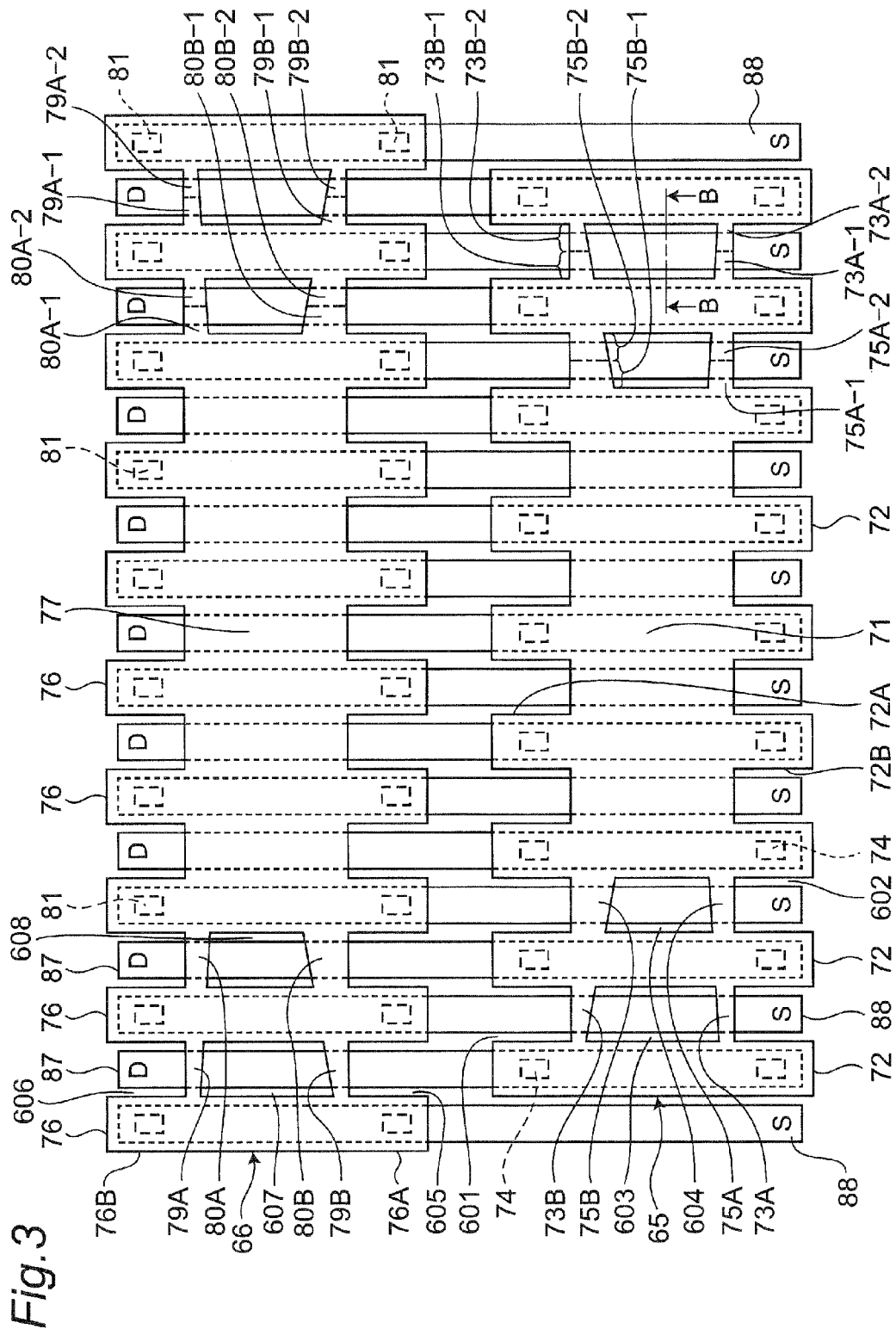
FIG. 3 is a plan view of a second embodiment of the FET according to the invention.
Figure 4:
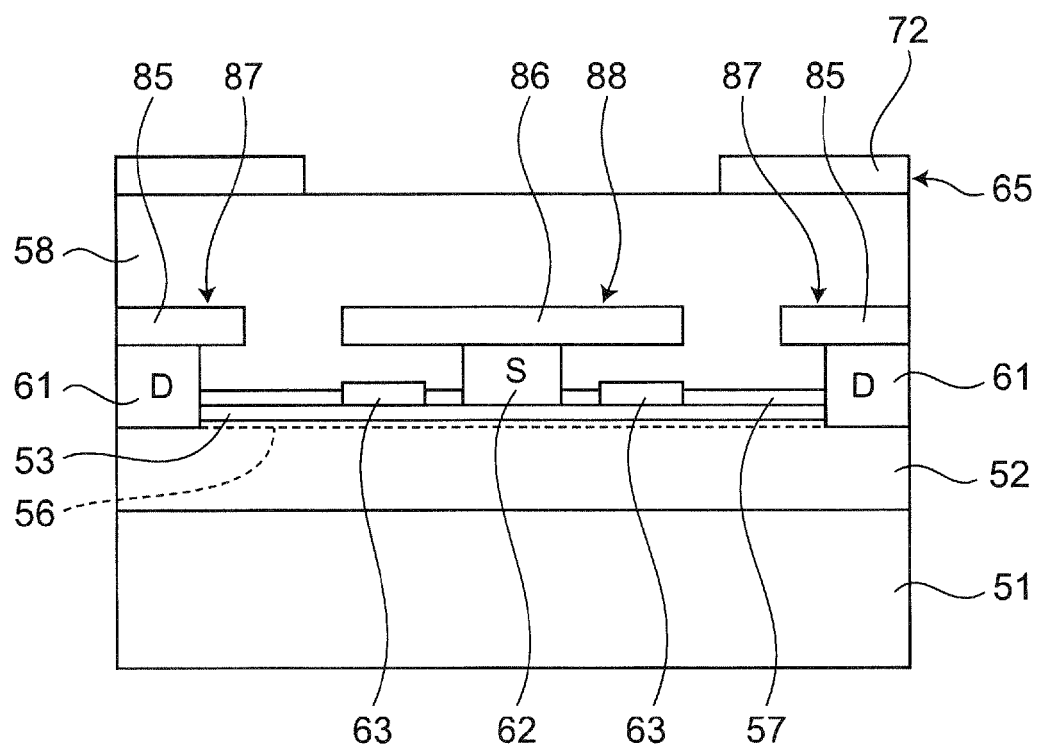
FIG. 4 is a sectional view showing a B-B cross section of FIG. 3.

FIG. 3 is a schematic plan view of a GaN HFET (Heterojunction Field-Effect Transistor) which is a second embodiment of the invention. FIG. 4 is a sectional view showing a B-B cross section of FIG. 3.

In the GaN HFET of this second embodiment, as in the foregoing first embodiment, an undoped GaN layer 52 and an undoped AlGaN layer 53 are stacked one by one on a Si substrate 51. The undoped GaN layer 52 and the undoped AlGaN layer 53 constitute a GaN-based multilayer body having a heterojunction formed therein.

A 2DEG (2-Dimensional Electron Gas) 56 is generated at an interface between the undoped GaN layer 52 and the undoped AlGaN layer 53. Also, a protective film 57 and an interlayer insulating film 58 are formed one by one on the GaN-based multilayer body. Material of the protective film 57, for which SiN is used as an example in this case, may also be $SiO_2$, $Al_2O_3$, or the like. Also, material of the interlayer insulating film 58, for which polyimide is used as an example in this case, may be an insulating material such as SOG (Spin On Glass) BPSG (Boron Phosphorous Silicate Glass) or the like. Film thickness of the SiN protective film 57, which is set to 150 nm as an example in this case, may also be set within a range of 20 nm to 250 nm.

A recess reaching the undoped GaN layer 52 is formed in the GaN-based multilayer body. In this recess, a drain electrode base portion 61 and a source electrode base portion 62 are formed to serve as ohmic electrodes. The drain electrode base portion 61 and the source electrode base portion 62 are provided each as a Ti/Al/TiN electrode as an example, in which Ti layer, Al layer and TiN layer are stacked one by one. Also, on the drain electrode base portion 61, a drain electrode interconnection 85 is formed from the same material as that of the drain electrode base portion 61. On the source electrode base portion 62, a source electrode interconnection 86 is formed from the same material as that of the source electrode base portion 62. The drain electrode base portion 61 and the drain electrode interconnection 85 constitute a drain electrode 87. Also, the source electrode base portion 62 and the source electrode interconnection 86 constitute a source electrode 88.

Also, openings are formed in the protective film 57, and a gate electrode 63 is formed in the openings. The gate electrode 63 is formed of, for example, TiN so as to be a Schottky electrode having Schottky junction with the undoped AlGaN layer 53.

As shown in FIG. 3, this second embodiment has a plurality of finger-like drain electrodes 87 and a plurality of finger-like source electrodes 88. The source electrodes 88 and the drain electrodes 87 are arrayed so as to be alternated in a direction crossing the lengthwise direction in which the drain electrodes 87 and the source electrodes 88 extend in the finger-like configuration.

As shown in FIGS. 3 and 4, a drain electrode pad and a source electrode pad 66 are formed on the interlayer insulating film 58.

The drain electrode pad 65 has a plurality of lengthwise-direction portions 72 extending lengthwise along the drain electrodes 87. Also, the drain electrode pad 65 has a bonding portion 71 for bonding use at a generally central portion. At this bonding portion 71, a plurality (five in FIG. 3) of lengthwise-direction portions 72 are integrated with the bonding portion 71.

The drain electrode pad 65 further has second connecting portions 73A and first connecting portions 73B as well as second connecting portions 75A and first connecting portions 75B extending in a direction crossing the lengthwise direction and respectively connecting to two adjacent lengthwise-direction portions 72.

With regard to the second connecting portion 73A, its lengthwise length to a lengthwise center of the drain electrode 87 is longer than a lengthwise length between the first connecting portion 73B and the lengthwise center of the drain electrode 87. Then, the area of the first connecting portion 73B is larger than the area of the second connecting portion 73A.

Also, with regard to the second connecting portion 75A, its lengthwise length to a lengthwise center of the drain electrode 87 is longer than a lengthwise length between the first connecting portion 75B and the lengthwise center of the drain electrode 87. Then, the area of the first connecting portion 75B is larger than the area of the second connecting portion 75A.

By virtue of the arrangement that the area of the first connecting portions 73B, 75B closer to the lengthwise center of the drain electrode 87 than the second connecting portions 73A, 75A is set larger than the area of the second connecting portions 73A, 75A as described above, the current collecting efficiency of the drain electrode pad 65 can be improved and moreover the reliability as interconnections can be improved, as will be described later.

The second connecting portions 73A and the first connecting portions 73B are separate from each other by a predetermined length in the lengthwise direction. The second connecting portion 73A is provided at a position closer to the lengthwise end portion 72B than to the lengthwise center of the lengthwise-direction portion 72. Also, the first connecting portion 73B is provided at a position closer to the lengthwise end portion 72A than to the lengthwise center of the lengthwise-direction portion 72. Further, the second connecting portions 73A and the first connecting portions 73B have lengthwise lengths increasing more and more toward the bonding portion 71.

That is, with regard to the connecting portion 73A, an area of a first portion 73A-1 closer to the bonding portion 71 is larger than an area of a second portion 73A-2 farther from the bonding portion 71. Also, with regard to the connecting portion 73B, an area of a first portion 73B-1 closer to the bonding portion 71 is larger than an area of a second portion 73B-2 farther from the bonding portion 71.

A lengthwise length of one end of the connecting portion 73B on the bonding portion 71 side is longer than a lengthwise length of one end of the connecting portion 73A on the bonding portion 71 side.

The connecting portion 75A and the connecting portion 75B are separate from each other by a predetermined length in the lengthwise direction. The connecting portion 75A is provided at a position closer to the lengthwise end portion 72B than to the lengthwise center of the lengthwise-direction portion 72. Also, the connecting portion 75B is provided at a position closer to the lengthwise end portion 72A than to the lengthwise center of the lengthwise-direction portion 72. Further, the connecting portion 75A and the connecting portion 75B have lengthwise lengths increasing more and more toward the bonding portion 71.

That is, with regard to the connecting portion 75A, an area of a first portion 75A-1 closer to the bonding portion 71 is larger than an area of a second portion 75A-2 farther from the bonding portion 71. Also, with regard to the connecting portion 75B, an area of a first portion 75B-1 closer to the bonding portion 71 is larger than an area of a second portion 75B-2 farther from the bonding portion 71.

Via holes 74 are formed at positions, in the interlayer insulating film 58, corresponding to both lengthwise end portions 72A, 72B of each lengthwise-direction portion 72 included in the drain electrode pad 65. Through these via holes 74, the individual lengthwise-direction portions 72 of the drain electrode pad 65 are electrically connected to the drain electrodes 87, respectively.

Meanwhile, the source electrode pad 66 has a plurality of lengthwise-direction portions 76 extending lengthwise along the source electrodes 88. Further, the source electrode pad 66 has a bonding portion 77 for bonding use at a generally central portion. In this bonding portion 77, a plurality (six in FIG. 3) of lengthwise-direction portions 76 are integrated with the bonding portion 77.

The source electrode pad 66 further has second connecting portions 79A and first connecting portions 79B as well as second connecting portions 80A and first connecting portions 80B extending in a direction crossing the lengthwise direction and respectively connecting to two adjacent lengthwise-direction portions 76.

With regard to the second connecting portion 79A, its lengthwise length to a lengthwise center of the source electrode 88 is longer than a lengthwise length between the first connecting portion 79B and the lengthwise center of the source electrode 88. Then, the area of the first connecting portion 79B is larger than the area of the second connecting portion 79A.

Also, with regard to the second connecting portion 80A, its lengthwise length to a lengthwise center of the source electrode 88 is longer than a lengthwise length between the first connecting portion 80B and the lengthwise center of the source electrode 88. Then, the area of the first connecting portion 80B is larger than the area of the second connecting portion 80A.

By virtue of the arrangement that the area of the first connecting portions 79B, 80B closer to the lengthwise center of the source electrode 88 than the second connecting portions 79A, 80A is set larger than the area of the second connecting portions 79A, 80A as described above, the current collecting efficiency of the source electrode pad 66 can be improved and moreover the reliability as interconnections can be improved, as will be described later.

The second connecting portions 79A and the first connecting portions 79B are separate from each other by a predetermined length in the lengthwise direction. The second connecting portion 79A is provided at a position closer to the lengthwise end portion 76B than to the lengthwise center of the lengthwise-direction portion 76. Also, the first connecting portion 79B is provided at a position closer to the lengthwise end portion 76A than to the lengthwise center of the lengthwise-direction portion 76. Further, the second connecting portions 79A and the first connecting portions 79B have lengthwise lengths increasing more and more toward the bonding portion 71.

That is, with regard to the second connecting portion 79A, an area of a first portion 79A-1 closer to the bonding portion 71 is larger than an area of a second portion 79A-2 farther from the bonding portion 71. Also, with regard to the first connecting portion 79B, an area of a first portion 79B-1 closer to the bonding portion 71 is larger than an area of a second portion 79B-2 farther from the bonding portion 71.

A lengthwise length of one end of the first connecting portion 79B on the bonding portion 71 side is longer than a lengthwise length of one end of the second connecting portion 79A on the bonding portion 71 side.

The second connecting portion 80A and the first connecting portion 80B are separate from each other by a predetermined length in the lengthwise direction. The second connecting portion 80A is provided at a position closer to the lengthwise end portion 76B than to the lengthwise center of the lengthwise-direction portion 76. Also, the first connecting portion 80B is provided at a position closer to the lengthwise end portion 76A than to the lengthwise center of the lengthwise-direction portion 76. Further, the second connecting portion 80A and the first connecting portion 80B have lengthwise lengths increasing more and more toward the bonding portion 77.

That is, with regard to the second connecting portion 80A, an area of a first portion 80A-1 closer to the bonding portion 77 is larger than an area of a second portion 80A-2 farther from the bonding portion 77. Also, with regard to the first connecting portion 80B, an area of a first portion 80B-1 closer to the bonding portion 77 is larger than an area of a second portion 80B-2 farther from the bonding portion 77.

In addition, although not shown in FIG. 3, the gate electrode 63 is connected to the gate electrode pad by gate electrode interconnection.

The GaN HFET of the second embodiment having the above-described structure, being the normally-ON type, is turned off with a negative voltage applied to the gate electrode 63.

As shown in FIG. 3, with regard to the source electrode pad 66 of the second embodiment, an area of regions where each connecting portions 79A, 79B, 80A, 80B cover the drain electrode 87 is smaller than an area of a region where each lengthwise-direction portion 76 covers the source electrode 88. Therefore, in this second embodiment, the source electrode pad 66 has an area of coverage regions over the drain electrodes 87 smaller than an area of coverage regions over the source electrodes 88. Thus, the parasitic capacitance between the source electrode pad 66 and the drain electrodes 87 can be reduced.

With regard to the drain electrode pad 65 of the second embodiment, an area of regions where each connecting portions 73A, 73E, 75A, 75B cover the source electrodes 88 is smaller than an area of a region where each lengthwise-direction portion 72 covers the drain electrode 87. Therefore, the drain electrode pad 65 has an area of coverage regions over the source electrodes 88 smaller than an area of coverage regions over the drain electrodes 87. Thus, the parasitic capacitance between the drain electrode pad 65 and the source electrodes 88 can be reduced.

By virtue of such a structure of the source electrode pad 66 and the drain electrode pad 65 as described above, the source-drain parasitic capacitance can be reduced in this second embodiment. Therefore, according to the second embodiment, the output capacitance which is a sum of the source-drain parasitic capacitance and the gate-drain parasitic capacitance can be reduced. Thus, ringing in switching operations can be prevented so that the switching speed can be improved and the switching loss can be reduced. Moreover, since the output capacitance is decreased, the high-frequency gain is increased.

Also in this second embodiment, since the drain electrode pad 65 is electrically connected to the drain electrodes 87 through the via holes 74 formed at the positions, in the interlayer insulating layer 58, corresponding to both the lengthwise end portions 72A, 72B of the drain electrode pad 65, the current collecting efficiency of the drain electrode pad 65 can be improved. Also, since the source electrode pad 66 is electrically connected to the source electrodes 88 through the via holes 81 formed at the positions, in the interlayer insulating layer 58, corresponding to both the lengthwise end portions 76A, 76B of the source electrode pad 66, the current collecting efficiency of the source electrode pad 66 can be improved.

Further in this second embodiment, the current collecting efficiency of the drain electrode pad 65 can be improved by virtue of the structure that with regard to the drain electrode pad 65, its area per unit length in a direction orthogonal to the lengthwise direction increases toward a farther-to-nearer direction with respect to the bonding portion 71, i.e. in an order of the second portion 73A-2 of the connecting portion 73A, the first portion 73A-1 of the connecting portion 73A, the second portion 75A-2 of the connecting portion 75A, and the first portion 75A-1 of the connecting portion 75A.

Also in this second embodiment, the current collecting efficiency of the drain electrode pad 65 can be improved by virtue of the structure that with regard to the drain electrode pad 65, its area per unit length in a direction orthogonal to the lengthwise direction increases toward a farther-to-nearer direction with respect to the bonding portion 71, i.e. in an order of the second portion 73B-2 of the connecting portion 73B, the first portion 73B-1 of the connecting portion 73B, the second portion 75B-2 of the connecting portions 75B, and the first portion 75B-1 of the connecting portion 75B.

Also in this second embodiment, the current collecting efficiency of the drain electrode pad 66 can be improved by virtue of the structure that with regard to the source electrode pad 66, its area per unit length in a direction orthogonal to the lengthwise direction increases toward a farther-to-nearer direction with respect to the bonding portion 71, i.e. in an order of the second portion 79A-2 of the connecting portion 79A, the first portion 79A-1 of the connecting portion 79A, the second portion 80A-2 of the connecting portion 80A, and the first portion 80A-1 of the connecting portion 80A.

Also in this second embodiment, the current collecting efficiency of the source electrode pad 66 can be improved by virtue of the structure that with regard to the source electrode pad 66, its area per unit length in a direction orthogonal to the lengthwise direction increases toward a farther-to-nearer direction with respect to the bonding portion 71, i.e. in an order of the second portion 79B-2 of the connecting portion 79B, the first portion 79B-1 of the connecting portion 79B, the second portion 80B-2 of the connecting portion 80B, and the first portion 80B-1 of the connecting portion 80B.

In this second embodiment, with regard to the drain electrode pad 65, an area of the first connecting portion 73B provided at a position closer to the end portion 72A of the lengthwise-direction portion 72 and covering a portion closer to the lengthwise center of the drain electrode 87 is larger than an area of the second connecting portion 73A provided at a position closer to the end portion 72B of the lengthwise-direction portion 72. Besides, the area of the first connecting portion 75B provided at a position closer to the end portion 72A of the lengthwise-direction portion 72 and covering a portion closer to the lengthwise center of the drain electrode 87 is larger than an area of the second connecting portion 75A provided at a position closer to the end portion 72B of the lengthwise-direction portion 72. As a result of this, the current collecting efficiency of the drain electrode pad 65 can be improved.

That is, in comparison to via holes 74 positioned at the end portion 72B on one side of the drain electrode pad 65 closer to the periphery of the lengthwise-direction portion 72, via holes 74 positioned on the other side of the drain electrode pad 65 closer to the central portion of the lengthwise-direction portion 72 have larger amounts of currents flowing therethrough. Therefore, by the setting that the first connecting portion 75B provided at a position closer to the device center-side end portion 72A is thicker than the second connecting portion 75A provided at a position closer to the device peripheral-side end portion 72B, the reliability as connecting portion interconnection can be improved.

Also in this second embodiment, with regard to the source electrode pad 66, the area of the first connecting portion 79B provided at a position closer to the end portion 76A of the lengthwise-direction portion 76 and covering a portion of the source electrode 88 closer to the lengthwise center is larger than the area of the second connecting portion 79A provided at the position closer to the end portion 76B of the lengthwise-direction portion 76. Further, the area of the first connecting portion 80B provided at the position closer to the end portion 76A of the lengthwise-direction portion 76 and covering a portion of the source electrode 88 closer to the lengthwise center is larger than the area of the second connecting portion 80A provided at the position closer to the end portion 76B of the lengthwise-direction portion 76. As a result of this, the current collecting efficiency of the source electrode pad 66 can be improved.

That is, in comparison to via holes 81 positioned at the end portion 76B on one side of the source electrode pad 66 closer to the periphery of the lengthwise-direction portion 76, via holes 81 positioned at the end portion 76A on the other side of the source electrode pad 66 closer to the center of the lengthwise-direction portion 76 have larger amounts of currents flowing therethrough. Therefore, by the setting that the connecting portion 80B provided at a position closer to the device center-side end portion 76A is thicker than the connecting portion 80A provided at a position closer to the device peripheral-side end portion 76B, the reliability as connecting portion interconnection can be improved.

Also in this second embodiment, since the drain electrode pad 65 is electrically connected to the drain electrodes 87 through the via holes 74 formed at the positions, in the interlayer insulating layer 58, corresponding to both the lengthwise end portions 72A, 72B of the drain electrode pad 65, the current collecting efficiency of the drain electrode pad 65 can be improved. Also, since the source electrode pad 66 is electrically connected to the source electrodes 88 through the via holes formed at the positions, in the interlayer insulating layer 58, corresponding to both the lengthwise end portions 76A, 76B of the source electrode pad 66, the current collecting efficiency of the source electrode pad 66 can be improved.

Third Embodiment

Figure 5:
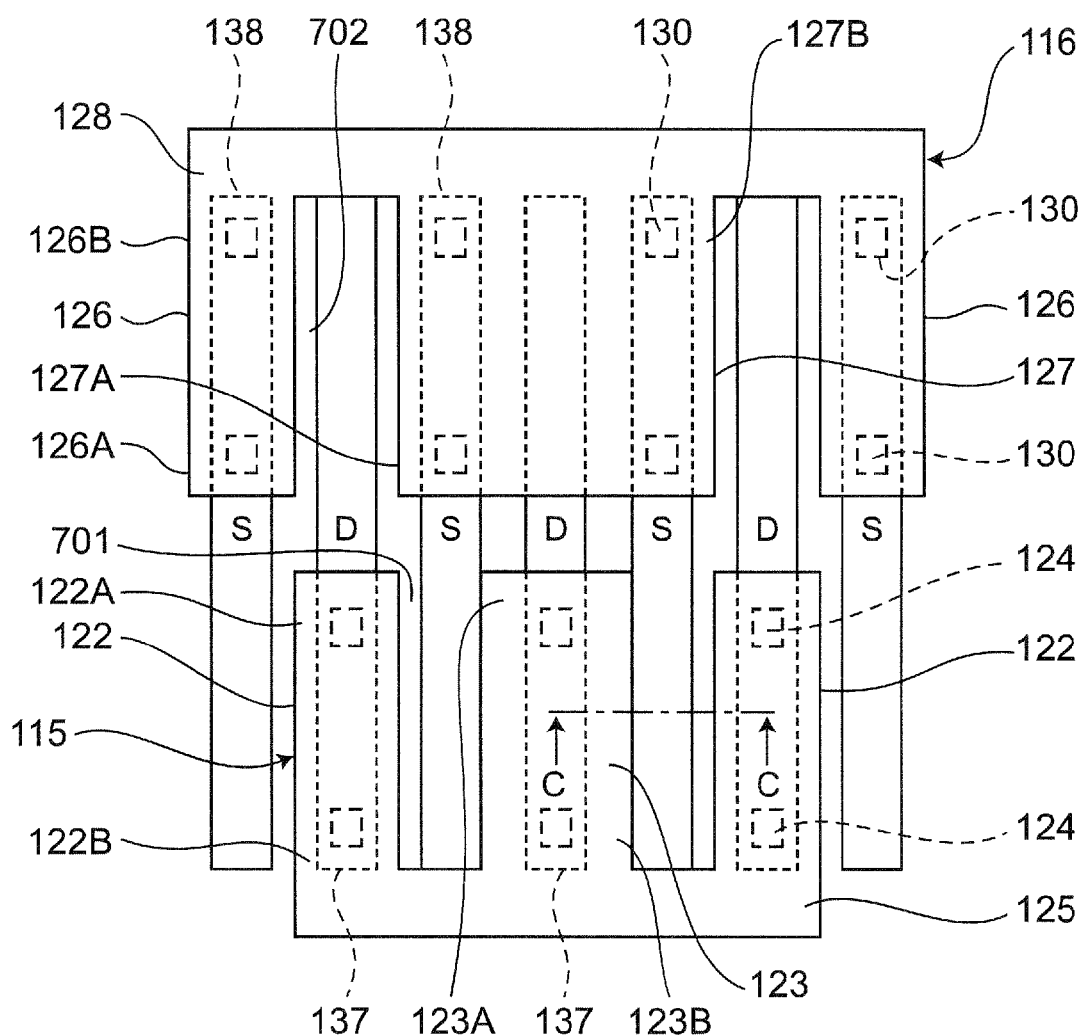
FIG. 5 is a plan view of a third embodiment of the FET according to the invention.
Figure 6:
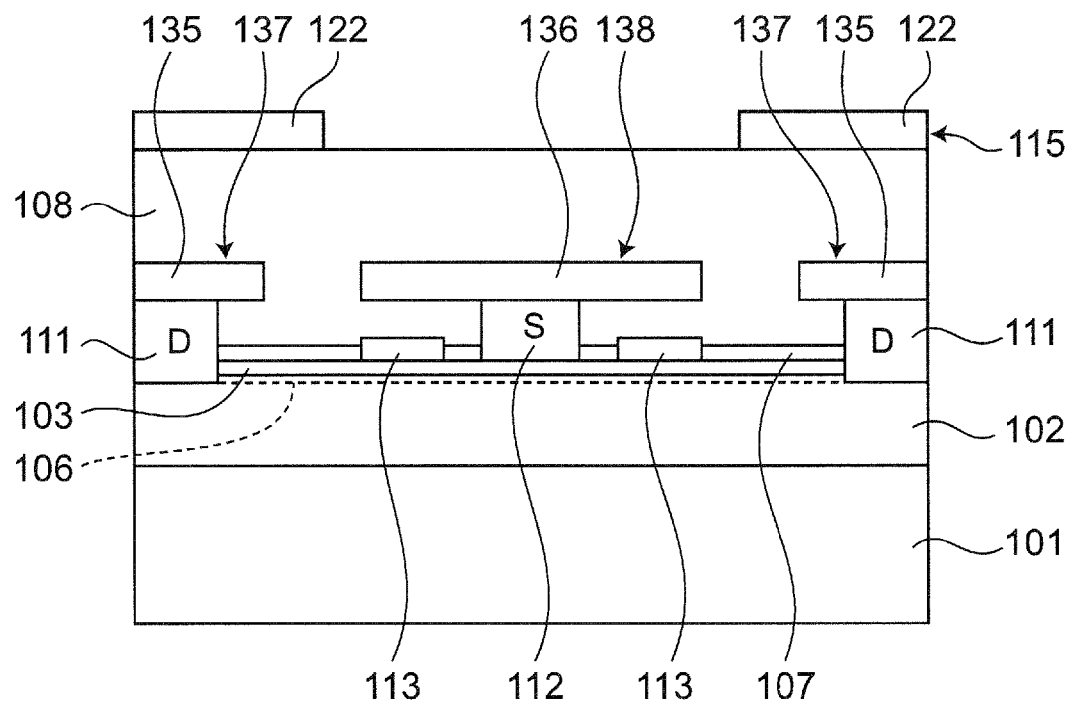
FIG. 6 is a sectional view showing a C-C cross section of FIG. 5.

FIG. 5 is a schematic plan view of a GaN HFET (Heterojunction Field-Effect Transistor) which is a third embodiment of the invention. FIG. 6 is a sectional view showing a C-C cross section of FIG. 5.

In the GaN HFET of this third embodiment, as in the foregoing first embodiment, an undoped GaN layer 102 and an undoped AlGaN layer 103 are stacked one by one on a Si substrate 101. The undoped GaN layer 102 and the undoped AlGaN layer 103 constitute a GaN-based multilayer body having a heterojunction formed therein.

A 2DEG (2-Dimensional Electron Gas) 106 is generated at an interface between the undoped GaN layer 102 and the undoped AlGaN layer 103. Also, a protective film 107 and an interlayer insulating film 108 are formed one by one on the GaN-based multilayer body. Material of the protective film 107, for which SiN is used as an example in this case, may also be $SiO_2$, $Al_2O_2$, or the like. Also, material of the interlayer insulating film 108, for which polyimide is used as an example in this case, may be an insulating material such as SOG (Spin On Glass) BPSG (Boron Phosphorous Silicate Glass) or the like. Film thickness of the SiN protective film 107, which is set to 150 nm as an example in this case, may also be set within a range of 20 nm to 250 nm.

A recess reaching the undoped GaN layer 102 is formed in the GaN-based multilayer body. In this recess, a drain electrode base portion 111 and a source electrode base portion 112 are formed to serve as ohmic electrodes. The drain electrode base portion 111 and the source electrode base portion 112 are provided each as a Ti/Al/TiN electrode as an example, in which Ti layer, Al layer and TiN layer are stacked one by one. Also, on the drain electrode base portion 111, a drain electrode interconnection 135 is formed from the same material as that of the drain electrode base portion 111. On the source electrode base portion 112, a source electrode interconnection 136 is formed from the same material as that of the source electrode base portion 112. The drain electrode base portion 111 and the drain electrode interconnection 135 constitute a drain electrode 137. Also, the source electrode base portion 112 and the source electrode interconnection 136 constitute a source electrode 138.

Also, openings are formed in the protective film 107, and a gate electrode 113 is formed in the openings. The gate electrode 113 is formed of, for example, TiN so as to be a Schottky electrode having Schottky junction with the undoped AlGaN layer 103.

As shown in FIG. 5, this third embodiment has a plurality of finger-like drain electrodes 137 and a plurality of finger-like source electrodes 138. The source electrodes 138 and the drain electrodes 137 are arrayed so as to be alternated in a direction crossing the lengthwise direction in which the drain electrodes 137 and the source electrodes 138 extend in the finger-like configuration.

As shown in FIGS. 5 and 6, a drain electrode pad 115 and a source electrode pad 116 are formed on the interlayer insulating film 108.

The drain electrode pad 115 has a plurality of lengthwise-direction portions 122, 123 extending lengthwise along the drain electrodes 137. The lengthwise-direction portion 123 is larger in width in a direction orthogonal to the lengthwise direction than the lengthwise-direction portions 122, where the lengthwise-direction portion 123 serves also as a bonding portion. The lengthwise-direction portion 123 is positioned between one lengthwise-direction portion 122 of a widthwise one end and the other lengthwise-direction portion 122 of the widthwise other end, i.e., positioned at a generally center of the drain electrode pad 115.

Also, the drain electrode pad 115 has a connecting portion 125 which extends in a direction crossing the lengthwise direction and which adjoins the lengthwise-direction portions 122, 123. This connecting portion 125 is positioned lengthwise outer than one end of the drain electrodes 137 and the source electrodes 138. Via holes 124 are formed at positions, in the interlayer insulating film 108, corresponding to both lengthwise end portions 122A, 1223, 123A, 1233 of the lengthwise-direction portions 122, 123 included in the drain electrode pad 115. Through these via holes 124, the individual lengthwise-direction portions 122, 123 of the drain electrode pad 115 are electrically connected to the drain electrodes 137, respectively.

Meanwhile, the source electrode pad 116 has a plurality of lengthwise-direction portions 126, 127 extending lengthwise along the source electrodes 138. The lengthwise-direction portion 127 is larger in width in a direction orthogonal to the lengthwise direction than the lengthwise-direction portions 126, where the lengthwise-direction portion 127 serves also as a bonding portion. The lengthwise-direction portion 127 is positioned between one lengthwise-direction portion 126 of a widthwise one end and the other lengthwise-direction portion 126 of the widthwise other end, i.e., positioned at a generally center of the source electrode pad 116.

Also, the source electrode pad 116 has a connecting portion 128 which extends in a direction crossing the lengthwise direction and which adjoins the lengthwise-direction portions 126, 127. This connecting portion 128 is positioned lengthwise outer than one end of the source electrodes 138 and the drain electrodes 137. Via holes 130 are formed at positions, in the interlayer insulating film 108, corresponding to both lengthwise end portions 126A, 126B, 127A, 127B of the lengthwise-direction portions 126, 127 included in the source electrode pad 116. Through these via holes 130, the individual lengthwise-direction portions 126, 127 of the source electrode pad 116 are electrically connected to the source electrodes 138, respectively.

In addition, although not shown in FIG. 5, the gate electrode 113 is connected to the gate electrode pad by gate electrode interconnection.

The GaN HFET of the third embodiment having the above-described structure, being the normally-ON type, is turned off with a negative voltage applied to the gate electrode 113.

As shown in FIG. 5, in the source electrode pad 116 of this third embodiment, the central lengthwise-direction portion 127 partly covers one drain electrode 137 and two source electrodes 138. Also, both-end two lengthwise-direction portions 126 partly cover the source electrodes 138 but do not cover the drain electrode 137. The connecting portion 128 of this source electrode pad 116 does not cover the drain electrode 137. Thus, the parasitic capacitance between the source electrode pad 116 and the drain electrodes 137 can be reduced.

In the drain electrode pad 115 of this third embodiment, the central lengthwise-direction portion 123 and both-end two lengthwise-direction portions 122 cover the drain electrodes 137 but do not cover the source electrodes 138. The connecting portion 125 of this drain electrode pad 115 does not cover the source electrodes 138. Thus, the parasitic capacitance between the drain electrode pad 115 and the source electrodes 138 can be reduced.

By virtue of such a structure of the source electrode pad 116 and the drain electrode pad 115 as described above, the source-drain parasitic capacitance can be reduced in this third embodiment. Therefore, according to the third embodiment, the output capacitance, which is a sum of the source-drain parasitic capacitance and the gate-drain parasitic capacitance, can be reduced. Thus, ringing in switching operations can be prevented so that the switching speed can be improved and the switching loss can be reduced. Moreover, since the output capacitance is decreased, the high-frequency gain is increased.

Also in this third embodiment, since the drain electrode pad 115 is electrically connected to the drain electrodes 137 through the via holes 124 formed at the positions, in the interlayer insulating layer 108, corresponding to both the lengthwise end portions 122A, 122B, 123A, 123B of the lengthwise-direction portions 122, 123 of the drain electrode pad 115, the current collecting efficiency of the drain electrode pad 115 can be improved. Also, since the source electrode pad 116 is electrically connected to the source electrodes 138 through the via holes 130 formed at the positions in the interlayer insulating layer 108 corresponding to the lengthwise both-end portions 126A, 126B, 127A, 127B of the lengthwise-direction portions 126, 127 of the source electrode pad 116, the current collecting efficiency of the source electrode pad 116 can be improved.

Comparative Example of Second Embodiment

Figure 7:
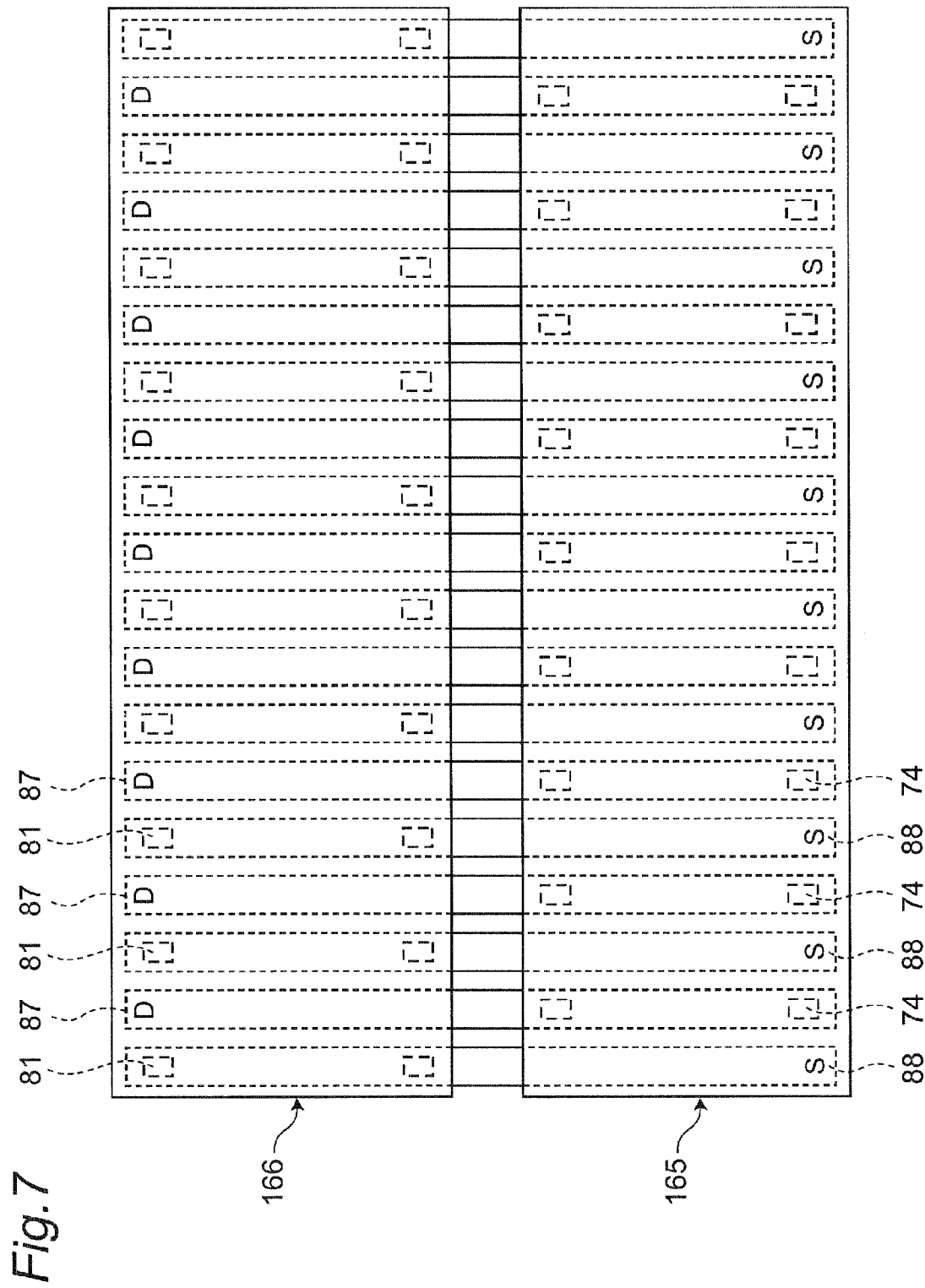
FIG. 7 is a plan view of an FET according to a comparative example.

Next, FIG. 7 is a schematic plan view of a comparative example of the above-described second embodiment. This comparative example differs from the second embodiment in only that a drain electrode pad 165 and a source electrode pad 166 are provided instead of the drain electrode pad 65 and the source electrode pad 66 in the second embodiment. Therefore, in this comparative example, the same component members as in the second embodiment are designated by the same reference signs, and the description will be focused mainly on differences from the second embodiment.

As shown in FIG. 7, the drain electrode pad 165 included in this comparative example is quadrangular shaped as a whole, in which a coverage area over the drain electrodes 87 is about 10% less than a coverage area over the source electrodes 88. Also, the source electrode pad 166 included in this comparative example is quadrangular shaped as a whole, in which a coverage area over the source electrodes 88 is about 10% more than a coverage area over the drain electrodes 87.

That is, in this comparative example, the coverage area over the drain electrodes 87 by the drain electrode pad 165 and the coverage area over the drain electrodes 87 by the source electrode pad 166 are generally equal to each other. The coverage area over the source electrodes 88 by the source electrode pad 166 and the coverage area over the source electrodes 88 by the drain electrode pad 165 are generally equal to each other.

Thus, the parasitic capacitance between the source electrode pad 166 and the drain electrodes 87 in this comparative example is larger than the parasitic capacitance between the source electrode pad 66 and the drain electrodes 87 in the foregoing second embodiment.

Also, the parasitic capacitance between the drain electrode pad 165 and the source electrodes 88 in this comparative example is larger than the parasitic capacitance between the drain electrode pad 65 and the source electrodes 88 in the foregoing second embodiment.

Thus, in this comparative example, since the source-drain parasitic capacitance is increased as compared with the foregoing second embodiment, such failures as ringing in switching operations, decreases in the switching speed and increases in the switching loss are more likely to occur.

Figure 8:
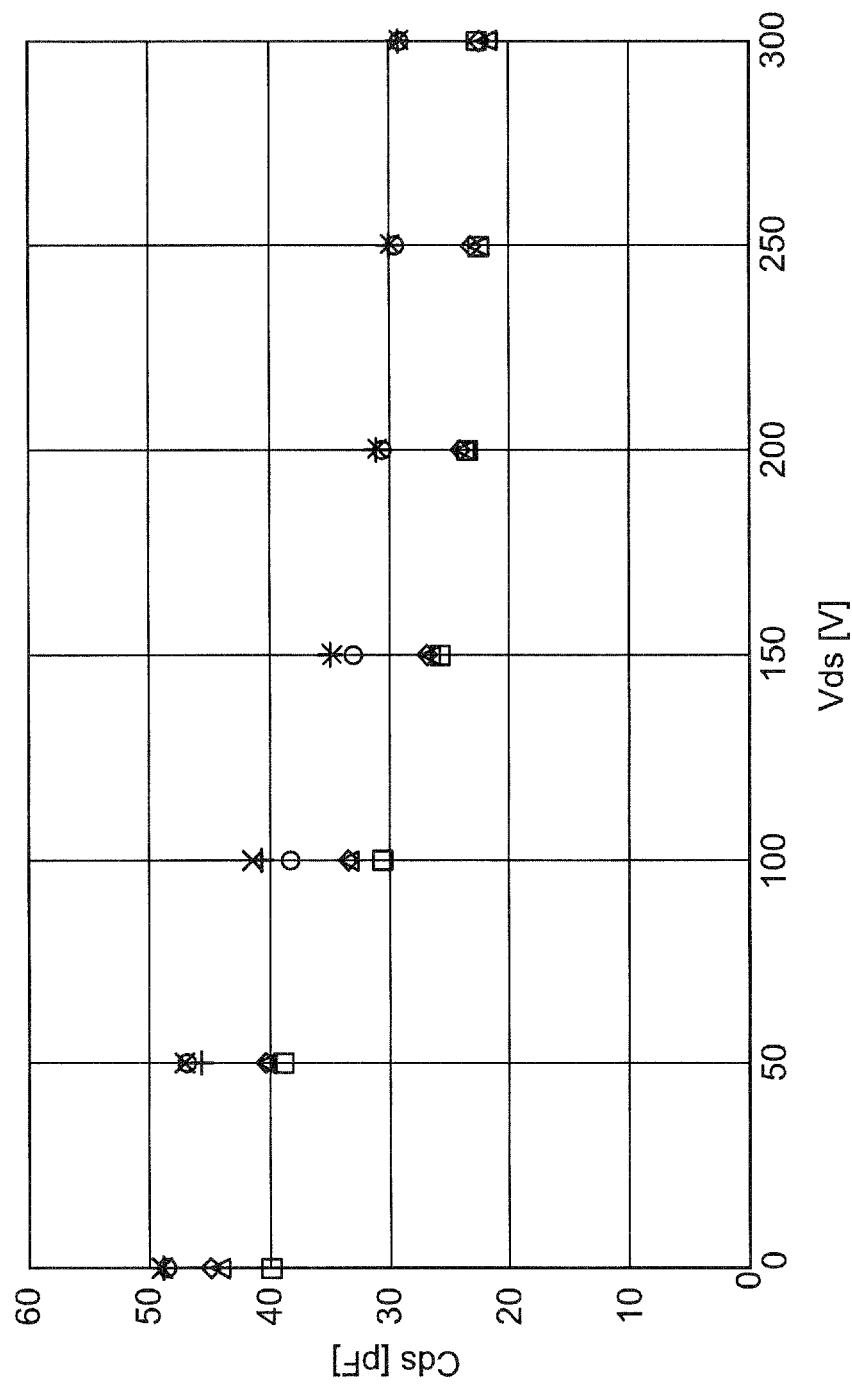
FIG. 8 is a characteristic view showing a source-drain parasitic capacitance of the second embodiment and a source-drain parasitic capacitance of the comparative example.

FIG. 8 is a plot of measurement results of source-drain parasitic capacitances Cds (pF) of three samples by the second embodiment as well as source-drain parasitic capacitances Cds (pF) of three samples by the comparative example. The vertical axis in FIG. 8 represents the source-drain parasitic capacitance Cds (pF), and the horizontal axis in FIG. 8 represents the source-drain voltage Vds (V).

In FIG. 8, white quadrangular mark □, white rhombus mark ◇ and white triangular mark △ are the plotted measurement results of the source-drain parasitic capacitance Cds (pF) on the three samples, respectively, according to the second embodiment. Also, in FIG. 8, white circular mark ○, x-like mark x and cross mark + are the plotted measurement results of the source-drain parasitic capacitance Cds (pF) on the three samples, respectively, according to the comparative example.

With the source-drain voltage Vds (V) set to 300 V, a three-point median of source-drain parasitic capacitances Cds (pF) of the three samples by the second embodiment was 22.5 pF. In contrast to this, with the source-drain voltage Vds (V) set to 300 V, a three-point median of source-drain parasitic capacitances Cds (pF) of the three samples by the comparative example was 29.0 pF. That is, the source-drain parasitic capacitance Cds (pF) of the samples by the second embodiment was able to be reduced by about 23% as compared with the source-drain parasitic capacitance Cds (pF) of the samples by the comparative example.

By the 23% reduction in the source-drain parasitic capacitance of the second embodiment as described above, one index Coss among indices of the output loss as the power device can be reduced by 21%. Thus, it has been realized to provide a GaN HFET of low loss. It is noted that the term 'Coss' refers to a sum of the source-drain capacitance Cds and the gate-drain capacitance Cdg, being called as output capacitance.

In the second embodiment, the thickness of the interlayer insulating film is set to the same thickness as that of the interlayer insulating film of the comparative example. However, in the second embodiment, on condition that the thickness of the interlayer insulating film is set larger than the thickness of the interlayer insulating film of the comparative example, the source-drain parasitic capacitance can be reduced to 40% of the source-drain parasitic capacitance of the comparative example.

Cascode Connection Circuit

Figure 9:
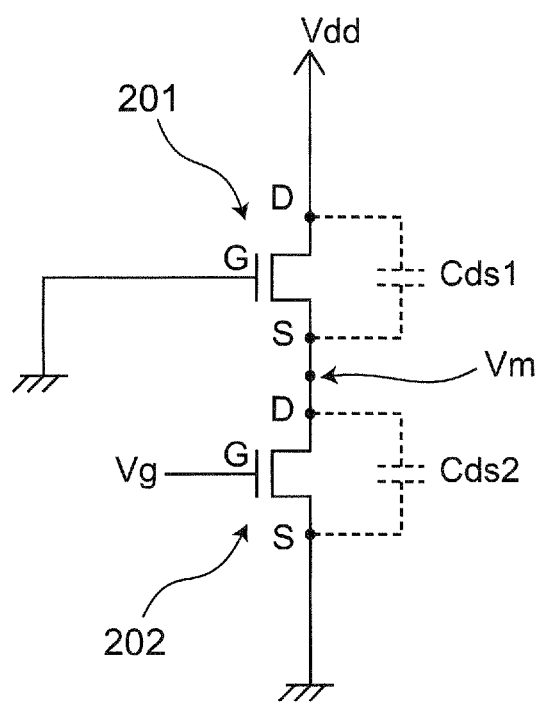
FIG. 9 is a circuit diagram showing circuitry of a semiconductor device in which a normally-ON type GaN FET of one embodiment of the invention and a normally-OFF type Si MOSFET 202 are cascode-connected to each other.

FIG. 9 is a circuit diagram showing circuitry of a semiconductor device in which a normally-ON type GaN HFET (Heterojunction Field-Effect Transistor) 201 according to any one of the above-described first to third embodiments and a normally-OFF type Si MOSFET (MOS Field-Effect Transistor) 202 are cascode-connected to each other.

With regard to the normally-ON type GaN HFET 201, a power supply voltage Vdd is supplied to the drain and a ground voltage is supplied to the gate while the source is electrically connected to the drain of the normally-OFF type Si MOSFET 202. Also with regard to the normally-OFF type Si MOSFET 202, a control voltage Vg is applied to the gate while a ground voltage is supplied to the source.

In this semiconductor device, when the supply of the power supply voltage Vdd is started, the gate voltage of the normally-ON type GaN HFET 201 is 0 V while this HFET 201 is in an ON state. In this case, from the ON state in which a control voltage Vg exceeding a threshold value is applied to the gate of the normally-OFF type Si MOSFET 202, a control voltage Vg of 0 V is applied thereto so that the MOSFET 202 is turned to an OFF state.

Then, a current flows to the source-drain parasitic capacitance Cds2 of the MOSFET 202 via the GaN HFET 201 remaining in the ON state by the power supply voltage Vdd. As a result, the source voltage of the GaN HFET 201 is increased.

Thereafter, when the source voltage of the GaN HFET 201 becomes larger than an absolute value of the threshold of the GaN HFET 201, the GaN HFET 201 is turned off. Then, by the power supply voltage Vdd, a current flows to the source-drain parasitic capacitance Cds1 of the GaN HFET 201, so that the drain voltage of the GaN HFET 201 is increased.

As the drain voltage of the GaN HFET 201 is increased, a midpoint potential Vm is also increased in response to the capacitive coupling ratio.

According to the GaN HFET 201 of the embodiment, since the source-drain parasitic capacitance Cds1 can be reduced, it follows that the capacitive coupling ratio can be reduced, increases in the OFF-state drain voltage can be suppressed, increases in the gate voltage can be suppressed, and increases in the midpoint potential Vm can be suppressed. As a consequence, the Si MOSFET 202 of low withstand voltage can be prevented from breaking down (or deteriorating) due to increases in the midpoint potential Vm.

Figure 10:
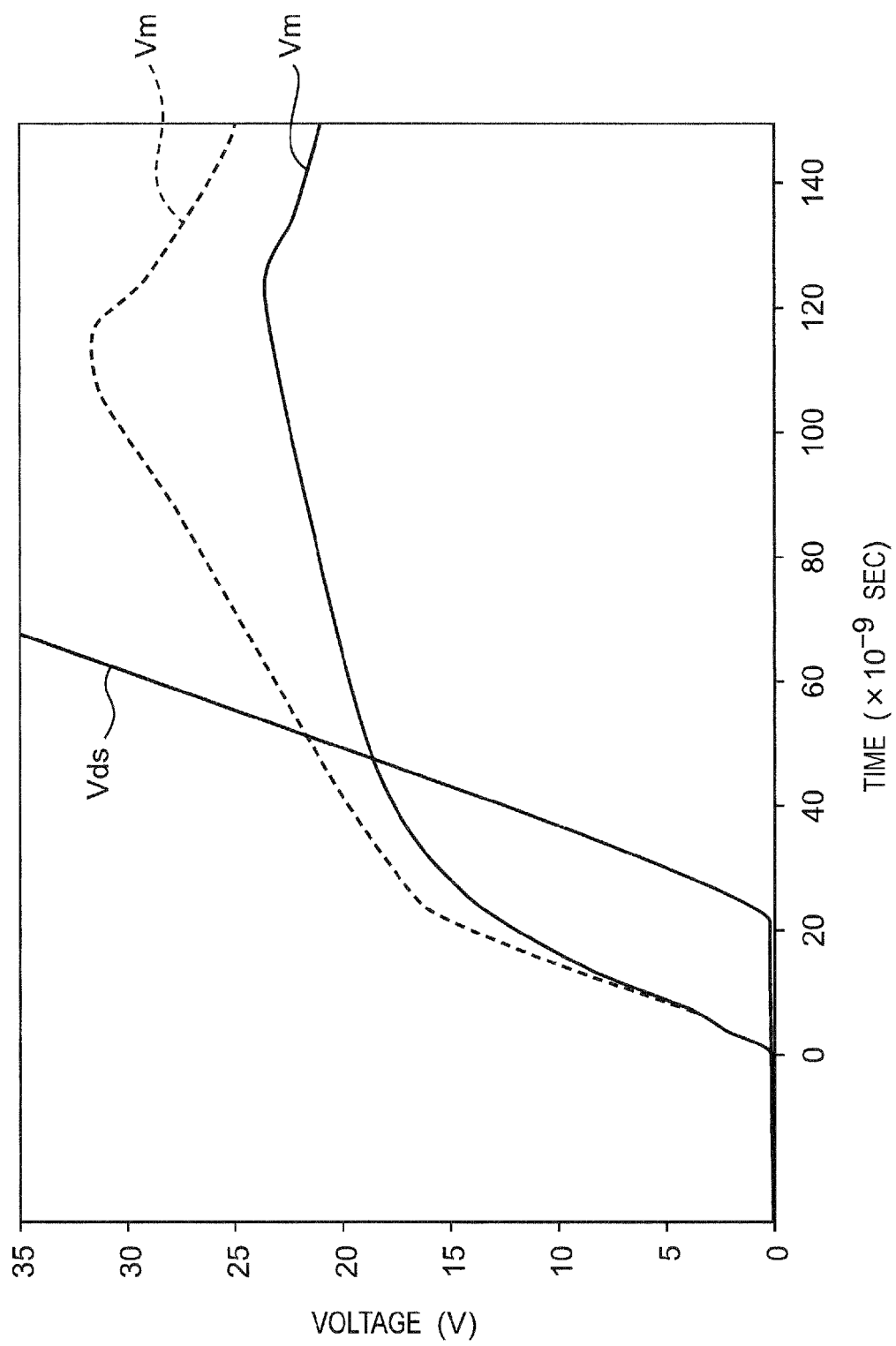
FIG. 10 is a graph showing an OFF-state midpoint potential Vm of a cascade circuit using the second embodiment as well as an OFF-state midpoint potential Vm of a cascade circuit using the comparative example of the second embodiment.

Measurement Results of OFF-State Voltage Waveform in Cascode Connection Circuit FIG. 10 shows, in solid line, a measurement result of the OFF-state voltage waveform in a cascode connection circuit of a working example in which the GaN HFET (FIG. 3) of the second embodiment is replaced with the normally-ON type GaN HFET 201 in the cascode circuit diagram of FIG. 9. It is noted that the horizontal axis of FIG. 10 represents elapsed time from when the normally-ON type GaN HFET 201 has been turned off.

A curved line Vm shown in solid line in FIG. 10 represents the OFF-state waveform of the midpoint potential Vm in this working example. Further, a curved line Vds shown in solid line represents the OFF-state waveform of the drain-source voltage of the HFET 201.

FIG. 10 also shows, in broken line, a measurement result of the OFF-state voltage waveform in the cascode circuit diagram of a comparative example in which the normally-ON type GaN HFET 201 is adopted for the comparative example (FIG. 7) of the second embodiment in the cascode circuit diagram of FIG. 9. A curved line Vm shown in broken line in FIG. 10 represents an OFF-state waveform of the midpoint potential Vm of the comparative example.

As can be understood from the measurement results of FIG. 10, with the cascode circuit using this working example, the maximum value of the midpoint potential Vm can be set to 24 V, proving that a 25% reduction from the maximum value of the midpoint potential Vm of the cascode circuit using the comparative example can be achieved.

The above embodiments have been described on HFETs in which a GaN layer and an AlGaN layer are stacked one by one on a Si substrate. However, it is also allowable to use a sapphire substrate or a SiC substrate for the substrate, where a nitride semiconductor layer may be grown on the sapphire substrate or Si substrate, or nitride semiconductor layers may be grown on a substrate made of a nitride semiconductor, e.g., an AlGaN layer may be grown on a GaN substrate. Also, as required, buffer layers may be formed between the substrate and the individual layers. Further, a hetero-improvement layer made from AlN may also be formed between the undoped GaN layer and the undoped AlGaN layer. A GaN cap layer may also be formed on the undoped AlGaN layer.

Also, the above embodiments have been described on finger-type GaN HFETs having a plurality of source electrodes and a plurality of drain electrodes. However, without being limited to this, the invention may also be applied to FETs having one set of gate electrode, source electrode and drain electrode. Moreover, the invention may be applied to Si FETs without limitations to GaN HFETs.

In the first embodiment (FIG. 1), the drain electrode pad 15 has cutouts 501, 502 and openings 503 that allow the source electrodes 38 to be exposed between neighboring lengthwise-direction portions 22 while the source electrode pad 16 has cutouts 504, 505 and openings 506 that allow the drain electrodes 37 to be exposed between neighboring lengthwise-direction portions 26. However, it is also allowable that only any one of the drain electrode pad 15 and the source electrode pad 16 has only the cutouts out of the above-described cutouts and openings. A structure that the drain electrode pad 15 has the cutouts 501, 502 makes it possible to reduce the parasitic capacitance between the drain electrode pad 15 and the source electrodes 38. A structure that the source electrode pad 16 has the cutouts 504, 505 makes it possible to reduce the parasitic capacitance between the source electrode pad 16 and the drain electrodes 37.

Also, in the second embodiment (FIG. 3), the drain electrode pad 65 has cutouts 601, 602 and openings 603, 604 that allow the source electrodes 88 to be exposed between neighboring lengthwise-direction portions 72 while the source electrode pad 66 has cutouts 605, 606 and openings 607, 608 that allow the drain electrodes 87 to be exposed between neighboring lengthwise-direction portions 76. However, it is also allowable that only any one of the drain electrode pad 65 and the source electrode pad 66 has only the cutouts out of the above-described cutouts and openings. A structure that the drain electrode pad 65 has the cutouts 601, 602 makes it possible to reduce the parasitic capacitance between the drain electrode pad 65 and the source electrodes 88. A structure that the source electrode pad 66 has the cutouts 605, 606 makes it possible to reduce the parasitic capacitance between the source electrode pad 66 and the drain electrodes 87.

Also, in the third embodiment (FIG. 5), the drain electrode pad 115 has cutouts 701 that allow the source electrodes 138 to be exposed between neighboring lengthwise-direction portions 122, 123 while the source electrode pad 116 has cutouts 702 that allow the drain electrodes 137 to be exposed between neighboring lengthwise-direction portions 126, 127. However, it is also allowable that only any one of the drain electrode pad 115 and the source electrode pad 116 has only the above-described cutouts. A structure that the drain electrode pad 115 has the cutouts 701 makes it possible to reduce the parasitic capacitance between the drain electrode pad 115 and the source electrodes 138. A structure that the source electrode pad 116 has the cutouts 702 makes it possible to reduce the parasitic capacitance between the source electrode pad 116 and the drain electrodes 137.

Moreover, in the above-described embodiments, a recess reaching the undoped GaN layer is formed, and drain electrodes and source electrodes are formed to serve as ohmic electrodes in this recess. However, without forming the recess, it is also allowable that drain electrodes and source electrodes are formed on an undoped AlGaN layer formed on the undoped GaN layer, where the undoped AlGaN layer is made thinner in layer thickness so that the drain electrodes and the source electrodes become ohmic electrodes.

Further, in the above embodiments, the gate electrodes are formed from TiN, but may be formed from WN. Also, the gate electrodes may be formed from Ti/Au or Ni/Au. Also, the drain electrodes and the source electrodes are provided as Ti/Al/TiN electrodes as an example in the above embodiments, but may be provided as Ti/Al electrodes or Hf/Al electrodes or Ti/AlCu/TiN electrodes. Further, the drain electrodes and the source electrodes may be multilayer ones in which Ni/Au is stacked on Ti/Al or Hf/Al, or multilayer ones in which Pt/Au is stacked on Ti/Al or Hf/Al, or multilayer ones in which Au is stacked on Ti/Al or Hf/Al.

Also, the protective film is formed from SiN in the above embodiments, but may be formed from $SiO_2$, $Al_2O_3$ or the like or may also be provided as a multilayer film in which a $SiO_2$ film is stacked on a SiN film.

Also, the GaN-based multilayer body in the FET of the invention may be one including a GaN-based semiconductor layer represented by $Al_X In_Y Ga_{1-X-Y} N$ ($X \geq 0, Y \geq 0, 0 \leq X+Y<1$). That is, the GaN-based multilayer body may be one including AlGaN, GaN, InGaN or the like.

Also, the above embodiments have been described on normally-ON type FETs. However, the invention may also be applied to normally-OFF type HFETs. Moreover, without being limited to HFETs, the invention may also be applied to FETs in which the carrier moves laterally along the substrate surface, such as lateral-junction FETs, lateral power MOSFETs and the like.

Although specific embodiments of the present invention have been described hereinabove, yet the invention is not limited to the above embodiments and may be carried out as they are changed and modified in various ways within the scope of the invention.

REFERENCE SIGNS LIST 1, 51, 101 Si substrate
2, 52, 102 undoped GaN layer
3, 53, 103 undoped AlGaN layer
6, 56, 106 2DEG
7, 57, 107 protective film
8, 58, 108 interlayer insulating film
11, 61, 111 drain electrode base portion
12, 62, 112 source electrode base portion
13, 63, 113 gate electrode
15, 65, 115 drain electrode pad
16, 66, 116 source electrode pad
21, 27, 71, 77 bonding portion
22, 26, 72, 76, 122, 123, 126, 127 lengthwise-direction portion
23, 25, 28, 29 connecting portion
73B, 75B, 79B, 80B first connecting portion
73A, 75A, 79A, 80A second connecting portion
24, 30, 74, 81, 124, 130 via hole
35, 85, 135 drain electrode interconnection
36, 86, 136 source electrode interconnection
37, 87, 137 drain electrode
38, 88, 138 source electrode 73A-1, 73B-1, 75A-1, 75B-1, 79A-1, 79B-1, 80A-1, 80B-1 first portion
73A-2, 73B-2, 75A-2, 75B-2, 79A-2, 79B-2, 80A-2, 80B-2 second portion
201 normally-ON type GaN HFET
202 normally-OFF type Si MOSFET
501, 502, 504, 505, 601, 602, 605, 606, 701, 702 cutout
503, 506, 603, 604, 607, 608 opening

The invention claimed is:

1. A field-effect transistor comprising:
a source electrode provided on an active region of the field-effect transistor;
a drain electrode provided on the active region;
a gate electrode provided between the source electrode and the drain electrode;
a source electrode pad formed on the source electrode and electrically connected to the source electrode; and
a drain electrode pad formed on the drain electrode and electrically connected to the drain electrode,
the source electrode and the drain electrode each extending in a finger-like configuration,
the source electrode being formed so as to neighbor the drain electrode in a direction crossing a lengthwise direction in which the finger-like drain electrode extends, the source electrode extending in the lengthwise direction, and
an insulating layer provided on the drain electrode, the source electrode and the gate electrode, wherein
in the source electrode pad, an area of coverage regions over the drain electrode is smaller than an area of coverage regions over the source electrode, and
in the drain electrode pad, an area of coverage regions over the source electrode is smaller than an area of coverage regions over the drain electrode,
the finger-like drain electrode and the finger-like source electrode are arrayed in plurality so as to be alternated in the direction crossing the lengthwise direction, and
the drain electrode pad and/or the source electrode pad has:
a bonding portion for bonding use,
a plurality of lengthwise-direction portions extending in the lengthwise direction along the drain electrodes, and
a connecting portion extending in a direction crossing the lengthwise direction and connecting to two adjacent lengthwise-direction portions, and wherein
in the connecting portion, an area of a first portion separated from the bonding portion by a first distance is larger than an area of a second portion separated from the bonding portion by a second distance longer than the first distance.

2. The field-effect transistor as claimed in claim 1, wherein via holes for electrically connecting the drain electrode pad to the drain electrode are formed at positions, in the insulating layer, corresponding to lengthwise end portions of the drain electrode pad.

3. The field-effect transistor as claimed in claim 1, wherein via holes for electrically connecting the source electrode pad to the source electrode are formed at positions, in the insulating layer, corresponding to lengthwise end portions of the source electrode pad.

4. The field-effect transistor as claimed in claim 1, wherein the connecting portion of the drain electrode pad includes:
a first connecting portion connecting to two adjacent lengthwise-direction portions, and
a second connecting portion which connects to two adjacent lengthwise-direction portions, and wherein
a lengthwise length between the second connecting portion and a lengthwise center of the drain electrode is longer than a lengthwise length between the first connecting portion and the lengthwise center of the drain electrodes, and
an area of the first connecting portion is larger than an area of the second connecting portion.

5. The field-effect transistor as claimed in claim 1, wherein the connecting portion of the source electrode pad includes:
a first connecting portion connecting to two adjacent lengthwise-direction portions, and
a second connecting portion which connects to the two adjacent lengthwise-direction portions, and wherein
a lengthwise length between the second connecting portion and a lengthwise center of the source electrode is longer than a lengthwise length between the first connecting portion and the lengthwise center of the source electrode, and
an area of the first connecting portion is larger than an area of the second connecting portion.

6. A cascode connection circuit comprising the field-effect transistor as claimed in claim 1, wherein
the field-effect transistor is a normally-ON type field-effect transistor,
the cascode connection circuit further comprising a normally-OFF type silicon-based MOS field-effect transistor having a drain electrically connected to a source of the normally-ON type field-effect transistor, and wherein
a gate of the normally-ON type field-effect transistor and a source of the normally-OFF type silicon-based MOS field-effect transistor are electrically connected to each other, and on/off control for the cascode connection circuit is exerted by applying a control voltage to a gate of the normally-OFF type silicon-based MOS field-effect transistor.

7. The field-effect transistor as claimed in claim 1, further comprising
a GaN-based multilayer body having a heterojunction, wherein
the finger-like source electrode, the finger-like drain electrode and the insulating layer are formed on the GaN-based multilayer body,
the drain electrode pad is electrically connected to the drain electrode through a via hole formed in the insulating layer, and
the source electrode pad is electrically connected to the source electrode through a via hole formed in the insulating layer.

8. A field-effect transistor comprising:
a source electrode provided on an active region of the field-effect transistor;
a drain electrode provided on the active region;
a gate electrode provided between the source electrode and the drain electrode;
a source electrode pad formed on the source electrode and electrically connected to the source electrode; and
a drain electrode pad formed on the drain electrode and electrically connected to the drain electrode,
the source electrode and the drain electrode each extending in a finger-like configuration,
the source electrode being formed so as to neighbor the drain electrode in a direction crossing a lengthwise direction in which the finger-like drain electrode extends, the source electrode extending in the lengthwise direction,
the drain electrode pad and/or the source electrode pad having:

a plurality of lengthwise-direction portions extending in the lengthwise direction, and one or more connecting portions extending in a direction crossing the lengthwise direction and connecting to two adjacent lengthwise-direction portions, and wherein a total area of all the connecting portions is smaller than a total area of all the lengthwise-direction portions.

9. A cascode connection circuit comprising the field-effect transistor as claimed in claim 8, wherein the field-effect transistor is a normally-ON type field-effect transistor, the cascode connection circuit further comprising a normally-OFF type silicon-based MOS field-effect transistor having a drain electrically connected to a source of the normally-ON type field-effect transistor, and wherein a gate of the normally-ON type field-effect transistor and a source of the normally-OFF type silicon-based MOS field-effect transistor are electrically connected to each other, and on/off control for the cascode connection circuit is exerted by applying a control voltage to a gate of the normally-OFF type silicon-based MOS field-effect transistor.

10. A field-effect transistor comprising:

a source electrode provided on an active region of the field-effect transistor;

a drain electrode provided on the active region;

a gate electrode provided between the source electrode and the drain electrode;

a source electrode pad formed on the source electrode and electrically connected to the source electrode; and a drain electrode pad formed on the drain electrode and electrically connected to the drain electrode, the source electrode and the drain electrode each extending in a finger-like configuration, the source electrode being formed so as to neighbor the drain electrode in a direction crossing a lengthwise direction in which the finger-like drain electrode extends, the source electrode extending in the lengthwise direction, the drain electrode pad and/or the source electrode pad having:

a plurality of lengthwise-direction portions extending in the lengthwise direction, and a plurality of connecting portions extending in a direction crossing the lengthwise direction and connecting to two adjacent lengthwise-direction portions, and wherein an area of each of the lengthwise-direction portions is bigger than an area of each of the connecting portions.

11. A cascode connection circuit comprising the field-effect transistor as claimed in claim 10, wherein the field-effect transistor is a normally-ON type field-effect transistor, the cascode connection circuit further comprising a normally-OFF type silicon-based MOS field-effect transistor having a drain electrically connected to a source of the normally-ON type field-effect transistor, and wherein a gate of the normally-ON type field-effect transistor and a source of the normally-OFF type silicon-based MOS field-effect transistor are electrically connected to each other, and on/off control for the cascode connection circuit is exerted by applying a control voltage to a gate of the normally-OFF type silicon-based MOS field-effect transistor.

* * * * *